United States Patent
Ahn et al.

(10) Patent No.: US 6,979,871 B2
(45) Date of Patent: Dec. 27, 2005

(54) SEMICONDUCTOR DEVICE HAVING T-SHAPED GATE ELECTRODE AND METHOD OF MANUFACTURING THE SAME

(75) Inventors: Hokyun Ahn, Daejeon (KR); Jae Kyoung Mun, Daejeon (KR); Haecheon Kim, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 0 days.

(21) Appl. No.: 10/723,526

(22) Filed: Nov. 25, 2003

(65) Prior Publication Data

US 2004/0104443 A1   Jun. 3, 2004

(30) Foreign Application Priority Data

Nov. 26, 2002  (KR) ............... 10-2002-0074122

(51) Int. Cl.⁷ ............... H01L 29/76; H01L 29/94
(52) U.S. Cl. ............... 257/412; 257/410; 257/411
(58) Field of Search .......... 257/410, 411, 412; 438/216, 261, 287, 421, 585, 587, 588, 591, 438/592, 594, 595, 981

(56) References Cited

U.S. PATENT DOCUMENTS 5,034,608 A * 7/1991 Tavrow et al. ........... 250/338.3
6,329,230 B1 * 12/2001 Matsuda ................ 438/167
6,780,756 B1 * 8/2004 Farber et al. ............... 438/622

FOREIGN PATENT DOCUMENTS

JP       10-150054       2/1998
KR    1995-0028615       9/1995

OTHER PUBLICATIONS

D. Fanning, L. Witkowski, J. Stidham, H.-Q. Tserng, M. Muir and P. Saunier, Dielectrically defined optical T-gate for high power GaAs pHEMTs, Tri-Quint Semiconductor Texas, GaAs Mantech Conference, Apr. 8-11, 2002, San Diego, California.

* cited by examiner

Primary Examiner—Hung Vu
(74) Attorney, Agent, or Firm—Blakely Sokoloff Taylor & Zafman

(57) ABSTRACT

A semiconductor device in which a silica aerogel layer having a very low dielectric constant is used as an insulating layer such that parasitic capacitance between a gate electrode and a source electrode in a field effect transistor having a T-shaped gate electrode, and a method of manufacturing the same are provided. The semiconductor device includes a semiconductor substrate, source and drain electrodes, which are formed on the semiconductor substrate to make ohmic contact with the semiconductor substrate, a T-shaped gate electrode, which is formed between the source and drain electrodes on the semiconductor substrate, and an insulating layer including a silica aerogel layer, the silica aerogel layer being interposed between the gate electrode and the source and drain electrodes.

5 Claims, 7 Drawing Sheets

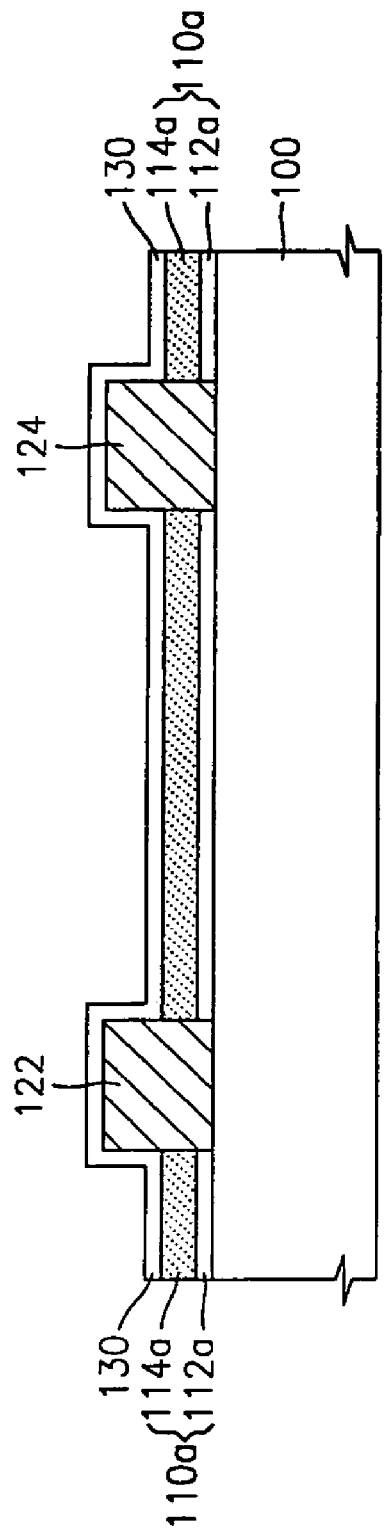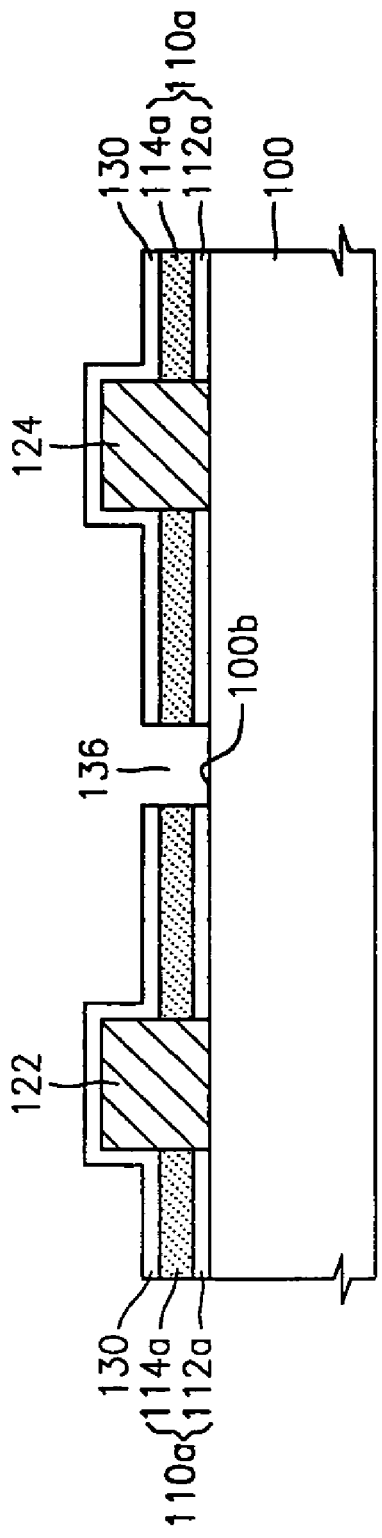

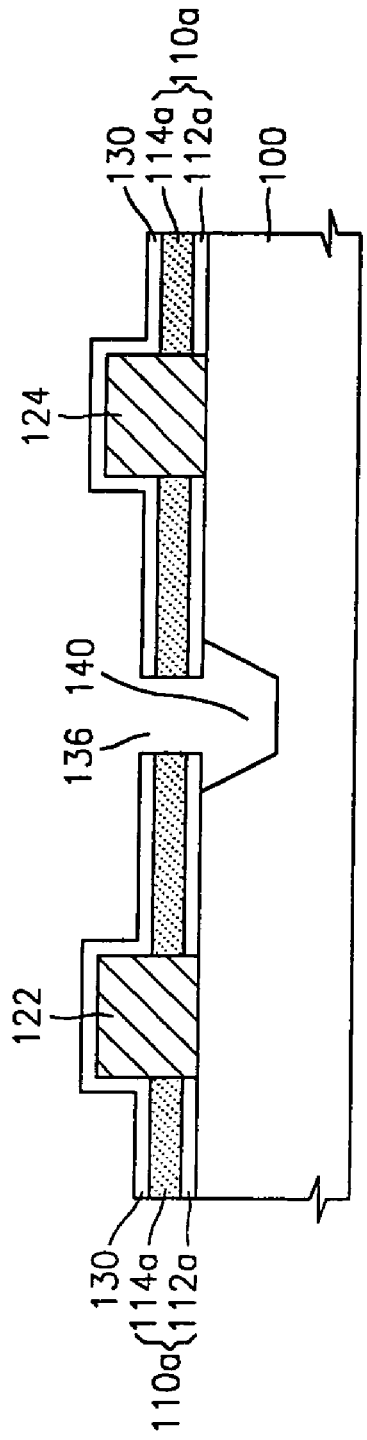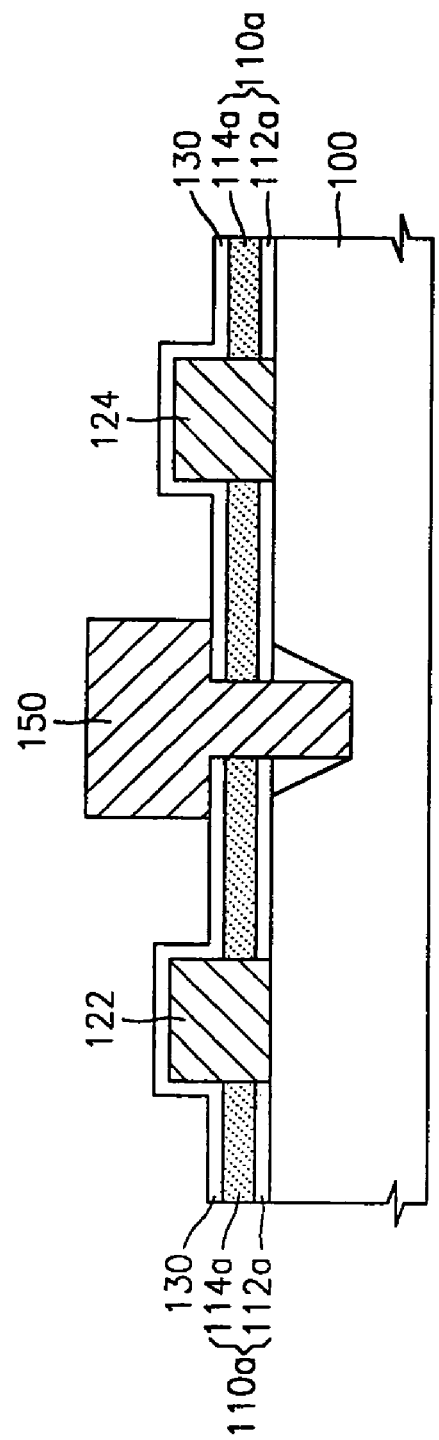

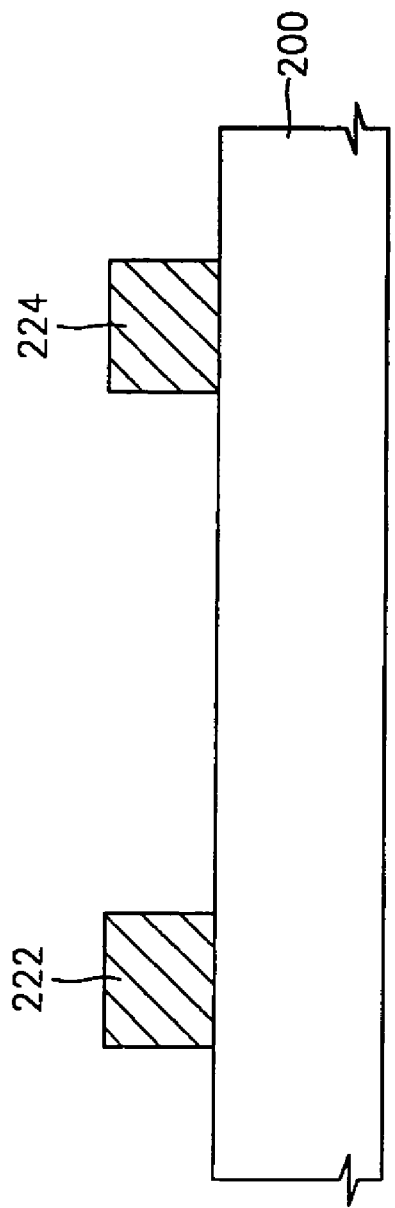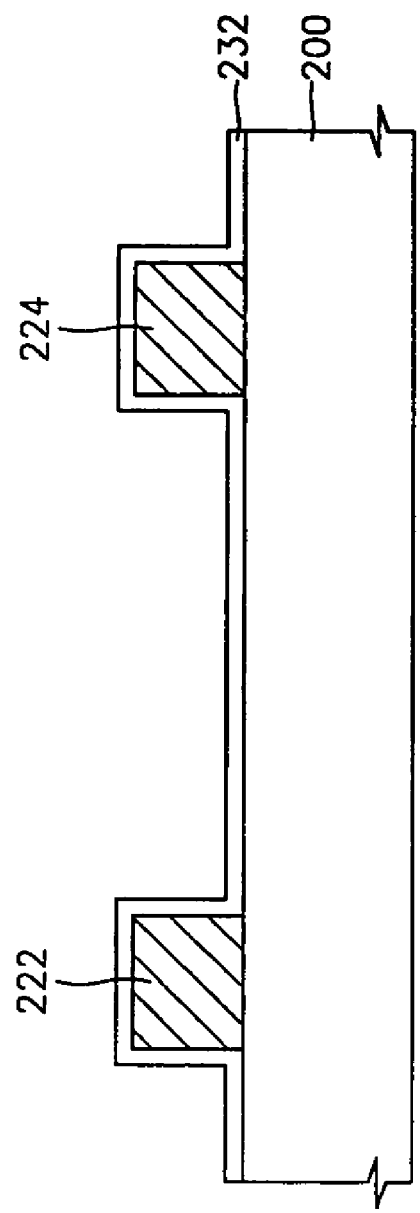

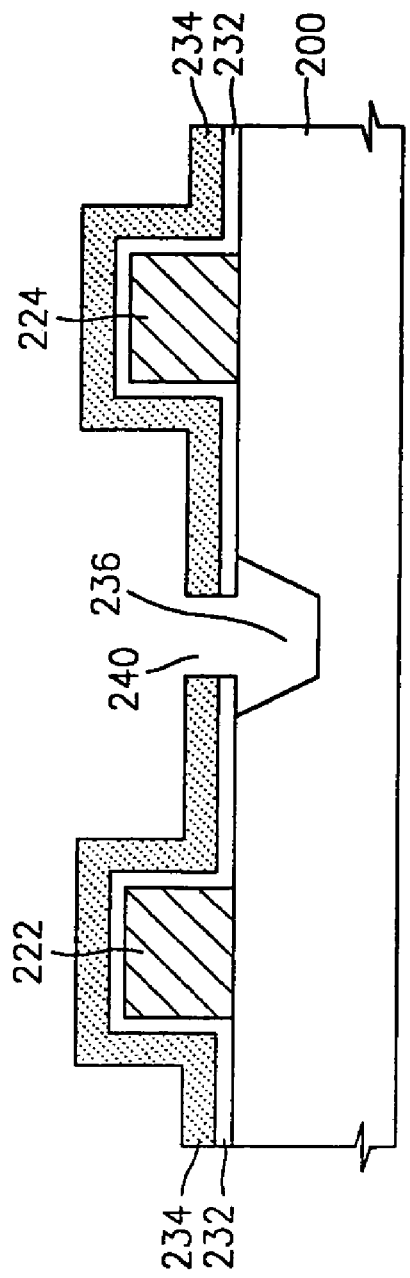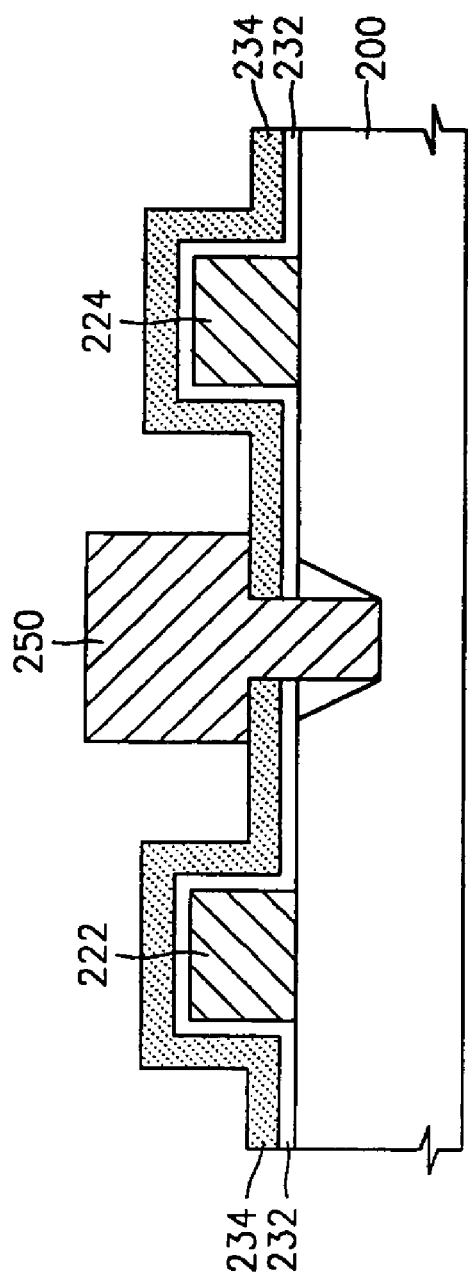

SEMICONDUCTOR DEVICE HAVING T-SHAPED GATE ELECTRODE AND METHOD OF MANUFACTURING THE SAME

BACKGROUND OF THE INVENTION

This application claims the priority of Korean Patent Application No. 2002-74122, filed on Nov. 26, 2002, in the Korean Intellectual Property Office, the disclosure of which is incorporated herein in its entirety by reference.

1. Field of the Invention

The present invention relates to a semiconductor device and a method of manufacturing the same, and more particularly, to a semiconductor device having a field effect transistor (FET) using a compound semiconductor, such as a metal-semiconductor field effect transistor (MESFET) or a high electron mobility transistor (HEMT), and a method of manufacturing the same.

2. Description of the Related Art

Recently, devices, such as an MESFET and a HEMT which are compound semiconductor microwave devices, are widely utilized to manufacture ultrahigh frequency integrated circuits (ICs). The devices have excellent noise characteristics in a radio frequency band and are essentially utilized to manufacture low noise amplifiers. The FETs used as a basic device for an IC employ a multi-level metallization (MLM) structure. A narrow and long interconnection is formed for such an MLM structure. In particular, an FET for an amplifier having an excellent radio frequency characteristic forms a T-shaped gate electrode, so as to perform a high-speed operation and have a high gain and a low noise characteristic, thereby reducing the length of a gate electrode.

A conventional FET having a T-shaped gate electrode uses a silicon nitride layer, so as to protect the surface of a compound semiconductor substrate. In this case, the silicon nitride layer is interposed between the T-shaped gate electrode and a source electrode. In this structure, parasitic capacitance exists between a head portion of the T-shaped gate electrode and the source electrode. As such, signal delay and electrical cross-talk occur, causing the operating speed of a device to restrict and reduce a cut-off frequency $f_T$. Thus, in order to solve the problem, a material having a lower dielectric constant needs to be used as an insulating layer.

SUMMARY OF THE INVENTION

The present invention provides a semiconductor device having an improved structure in which parasitic capacitance between a gate electrode and a source electrode is reduced such that deterioration of the characteristic of a device is prevented in a field effect transistor (FET) having a T-shaped gate electrode.

The present invention also provides a method of manufacturing a semiconductor device by which parasitic capacitance between a gate electrode and a source electrode is reduced in a field effect transistor (FET) having a T-shaped gate electrode.

According to an aspect of the present invention, there is provided a semiconductor device, the semiconductor device comprising a semiconductor substrate, source and drain electrodes, which are formed on the semiconductor substrate to make ohmic contact with the semiconductor substrate, a T-shaped gate electrode, which is formed between the source and drain electrodes on the semiconductor substrate, and an insulating layer including a silica aerogel layer, the silica aerogel layer being interposed between the gate electrode and the source and drain electrodes. The insulating layer is formed of a composite layer of the silicon nitride layer and the silica aerogel layer.

The silica aerogel layer may have a thickness greater than the thickness of the silicon nitride layer. The silicon nitride layer may have a thickness of 100–1000 Å, and the silica aerogel layer may have a thickness of 1000–3000 Å.

According to another aspect of the present invention, there is provided a method of manufacturing a semiconductor device. An insulating layer pattern is formed on a semiconductor substrate, the insulating layer pattern being formed of a composite layer of a first insulating layer and a silica aerogel layer and defining a first opening through which a first portion of the semiconductor substrate is exposed. Source and drain electrodes are formed on the semiconductor substrate exposed through the first opening. A second insulating layer for covering the source and drain electrodes and the insulating layer pattern is formed. The second insulating layer and the insulating layer pattern are patterned to form a second opening through which a second portion of the semiconductor substrate is exposed, between the source and drain electrodes. A T-shaped gate electrode is formed on the semiconductor substrate exposed through the second opening.

The first insulating layer may be a silicon nitride layer, and the second insulating layer may be formed of silica aerogel.

The method may further comprise etching the semiconductor substrate exposed through the second opening to form a recess region in the semiconductor substrate. In this case, the gate electrode is formed in the recess region.

According to another aspect of the present invention, there is provided a method of manufacturing a semiconductor device. Source and drain electrodes are formed on a semiconductor substrate. A first insulating layer for covering the source and drain electrodes and a top surface of the semiconductor substrate is formed. A silica aerogel layer is formed on the first insulating layer. The silica aerogel layer and the first insulating layer are patterned to expose a first portion of the semiconductor substrate. A T-shaped gate electrode is formed on the first exposed portion. The first insulating layer may be a silicon nitride layer.

According to the present invention, in a field effect transistor (FET) having a T-shaped gate electrode, parasitic capacitance between a gate electrode and a source electrode is reduced such that deterioration of the characteristic of a device is prevented, signal transmission is more quickly performed, and a device having an increased number of cut-off frequency in an RF characteristic is manufactured.

BRIEF DESCRIPTION OF THE DRAWINGS

The above aspects and advantages of the present invention will become more apparent by describing in detail preferred embodiments thereof with reference to the attached drawings in which:

FIGS. 1A through 1H are cross-sectional views illustrating a method of manufacturing a semiconductor device according to a first embodiment of the present invention; and FIGS. 2A through 2F are cross-sectional views illustrating a method of manufacturing a semiconductor device according to a second embodiment of the present invention.

DETAILED DESCRIPTION OF THE INVENTION

FIGS. 1A through 1H are cross-sectional views illustrating a method of manufacturing a semiconductor device according to a first embodiment of the present invention.

Figure 1A:
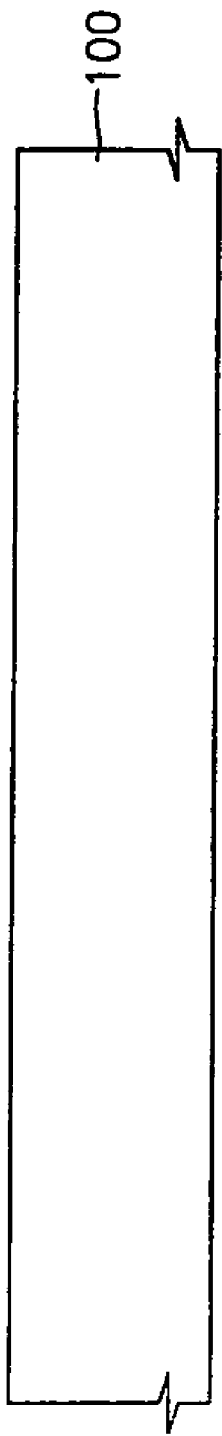

Referring to FIG. 1A, a semiconductor substrate 100 is prepared. The semiconductor substrate 100 may be formed of GaAs, InP, GaN, InGaP, InAlAs or AlGaAs, for example.

Figure 1B:
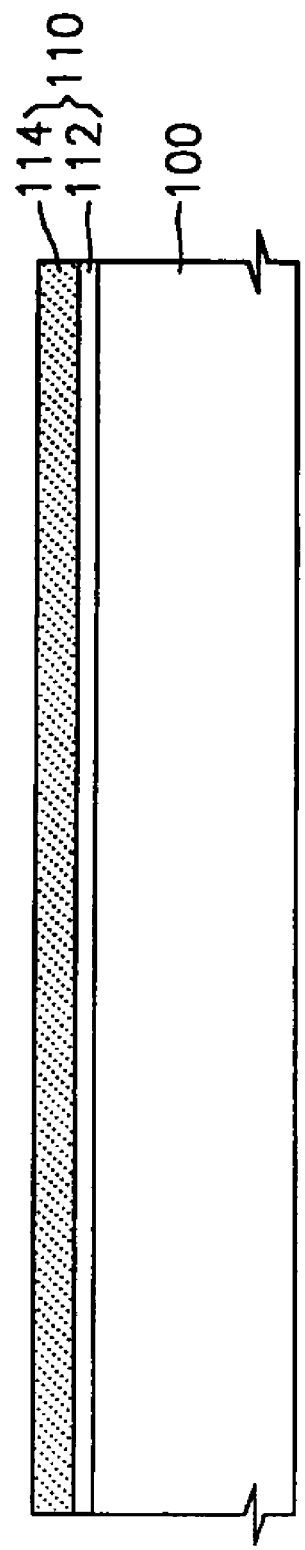

Referring to FIG. 1B, a first insulating layer 112 formed of a silicon nitride layer and a silica aerogel layer 114 are sequentially formed on the semiconductor substrate 100, thereby forming an insulating layer 110 formed of a composite layer thereof. In the insulating layer 110, the silica aerogel layer 114 is formed to a thickness greater than the thickness of the silicon nitride layer 112. The silicon nitride layer 112 forms a stable passivation layer on the surface of the semiconductor substrate 100.

Figure 1C:
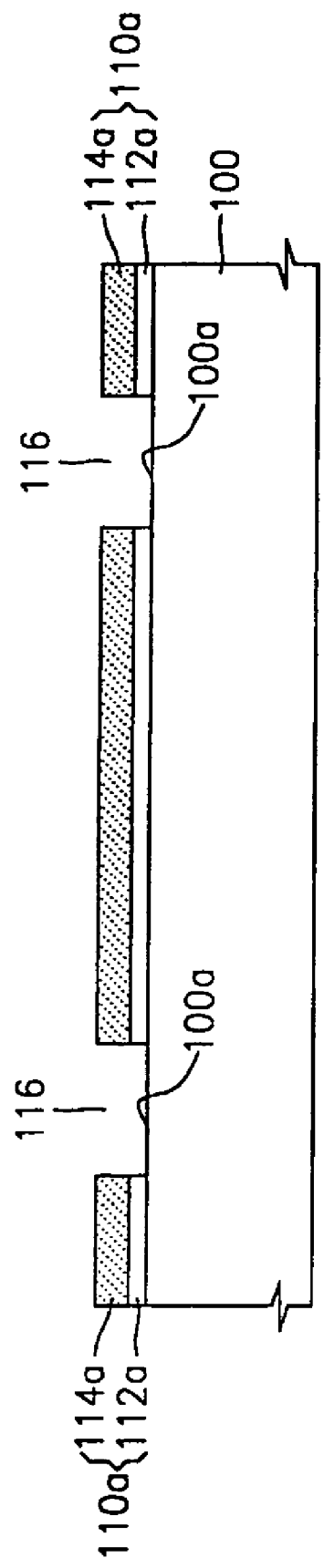

Referring to FIG. 1C, the silica aerogel layer 114 and the first insulating layer 112 are sequentially patterned using a wet or dry etching process, thereby forming an insulating layer pattern 110a comprising a first insulating layer pattern 112a and a silica aerogel layer pattern 114a to define a first opening 116 through which a first portion 100a of the semiconductor substrate 100 is exposed.

Figure 1D:
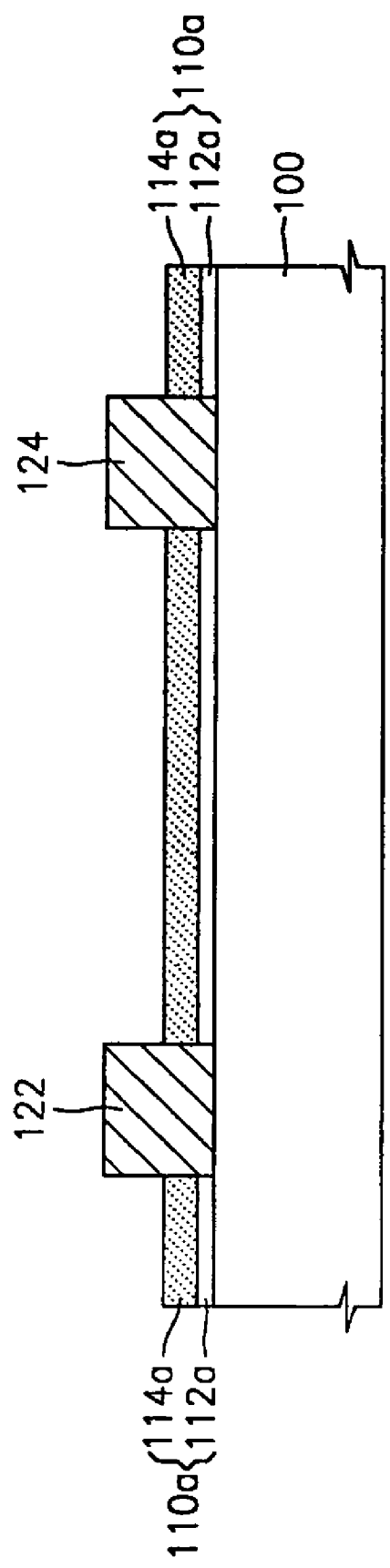

Referring to FIG. 1D, an ohmic metal is deposited on the semiconductor substrate 100 exposed through the first opening 116, thereby forming a source electrode 122 and a drain electrode 124. The source electrode 122 and the drain electrode 124 may be formed of various materials depending on material and structure of the semiconductor substrate 100. For example, the source electrode 122 and the drain electrode 124 may be formed of AuGe/Ni/Au.

Referring to FIG. 1E, a rapid thermal annealing process is performed on the source electrode 122 and the drain electrode 124 if necessary, and then, a second insulating layer 130 for covering the source electrode 122, the drain electrode 124, and the insulating layer pattern 110a is formed. Preferably, the second insulating layer 130 is formed of silica aerogel.

Referring to FIG. 1F, the second insulating layer 130 and the insulating layer pattern 110a are patterned using a wet or dry etching process, thereby forming a second opening 136 through which a second portion 100b of the semiconductor substrate 100 is exposed, between the source electrode 122 and the drain electrode 124.

Referring to FIG. 1G, a photosensitive layer pattern (not shown) for exposing the second portion 100b of the semiconductor substrate 100 through the second opening 136 is formed on the second insulating layer 130 in which the second opening 136 is formed. The photosensitive layer pattern is formed to define an opening (not shown), which communicates with the second opening 136 in an upper portion of the second opening 136 and has a width greater than the width of the second opening 136, and the opening has a negatively sloped sidewall. After that, the semiconductor substrate 100 exposed through the second opening 136 is etched, thereby forming a recess region 140 in the semiconductor substrate 100. Formation of the recess region 140 may be omitted as occasion demands.

Referring to FIG. 1H, a gate electrode formation material, for example, Ti/Pt/Au is deposited on the second portion 100b of the semiconductor substrate 100 in which the recess region 140 is formed, and the photosensitive layer pattern is removed using a lift-off process, thereby forming a T-shaped gate electrode 150. The gate electrode 150 may be formed of various materials depending on material and structure of the semiconductor substrate 100.

As described above, the silica aerogel layer pattern 114a is interposed between the gate electrode 150, the source electrode 122, and the drain electrode 124. In addition, preferably, the second insulating layer 130 formed between the gate electrode 150, the source electrode 122, and the drain electrode 124 is formed of silica aerogel. In this structure, the sum of the thickness of the silica aerogel layer pattern 114a and the thickness of the second insulating layer 130 is greater than the thickness of the first insulating layer pattern 112a. In particular, preferably, the first insulating layer pattern 112a formed of a silicon nitride layer has a thickness of about 100–1000 Å, and the total thickness of the second insulating layer 130 formed of silica aerogel and the silica aerogel layer pattern 114a is about 1000–3000 Å.

In the method of manufacturing the semiconductor device according to the first embodiment of the present invention, a silica aerogel layer is interposed between a head portion of a gate electrode and a source electrode. The silica aerogel layer has a dielectric constant equal to or less than 2.5, which is lower than the dielectric constant of a silicon nitride layer having a dielectric constant of 6–9.

Thus, parasitic capacitance between the head portion of the gate electrode and the source electrode is remarkably reduced.

FIGS. 2A through 2F are cross-sectional views illustrating a method of manufacturing a semiconductor device according to a second embodiment of the present invention.

Referring to FIG. 2A, an ohmic metal is deposited on a semiconductor substrate 200, thereby forming a source electrode 222 and a drain electrode 224.

The semiconductor substrate 200 may be formed of of GaAs, InP, GaN, InGaP, InAlAs or AlGaAs, for example. The source electrode 222 and the drain electrode 224 may be formed of various materials depending on material and structure of the semiconductor substrate 200. For example, the source electrode 222 and the drain electrode 224 may be formed of AuGe/Ni/Au.

Referring to FIG. 2B, a rapid thermal annealing process is performed on the source electrode 222 and the drain electrode 224 if necessary, and then, a first insulating layer 232 for covering the source electrode 222, the drain electrode 224, and a top surface of the semiconductor substrate 200 is formed. Preferably, the first insulating layer 232 is formed of a silica nitride layer. The first insulating layer 232 is formed to a thickness of about 100–1000 Å.

Figure 2C:
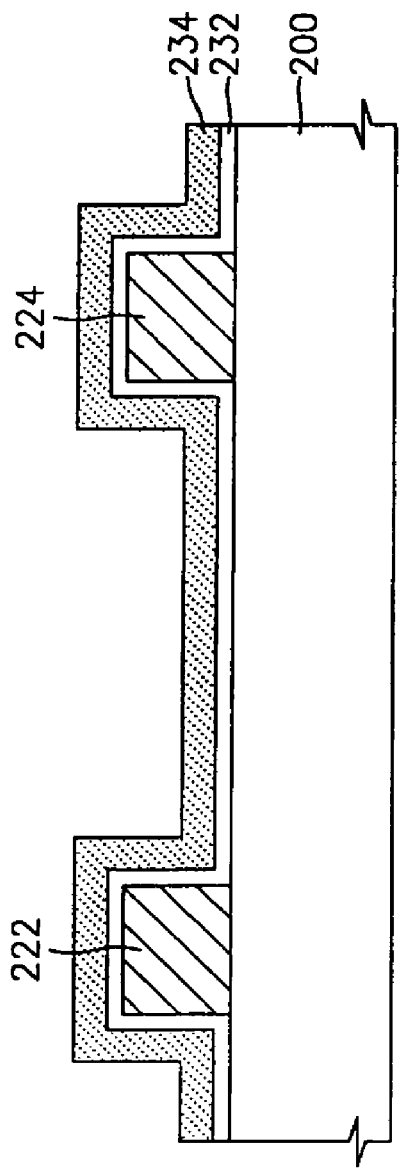

Referring to FIG. 2C, a silica aerogel layer 234 is formed on the first insulating layer 232. The silica aerogel layer 234 is formed to a thickness of about 1000–3000 Å.

Figure 2D:
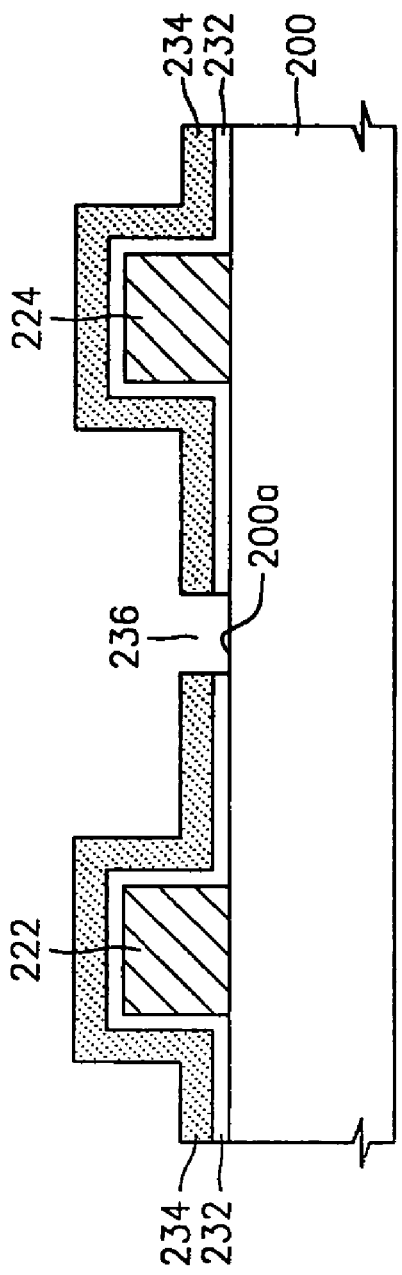

Referring to FIG. 2D, the silica aerogel layer 234 and the first insulating layer 232 are patterned using a wet or dry etching process, thereby forming an opening 236 through which a first portion 200a of the semiconductor substrate 200 is exposed, between the source electrode 222 and the drain electrode 224.

Referring to FIG. 2E, a photosensitive layer pattern (not shown) for exposing the first portion 200a of the semiconductor substrate 200 through the opening 236 is formed on the silica aerogel layer 234 in which the opening 236 is formed. The photosensitive layer pattern is formed to define an opening (not shown), which communicates with the opening 236 in an upper portion of the opening 236 and has a width greater than the width of the opening 236, and the opening has a negatively sloped sidewall. After that, the semiconductor substrate 200 exposed through the opening 236 is etched, thereby forming a recess region 240 in the semiconductor substrate 200. Formation of the recess region 240 may be omitted as occasion demands.

Referring to FIG. 2F, a gate electrode formation material, for example, Ti/Pt/Au is deposited on the first portion 200a of the semiconductor substrate 200 in which the recess region 240 is formed, and the photosensitive layer pattern is removed using a lift-off process, thereby forming a T-shaped gate electrode 250. The gate electrode 250 may be formed of various materials depending on material and structure of the semiconductor substrate 200.

In the structure of a device manufactured according to the second embodiment of the present invention, a silica aerogel layer is interposed between a gate electrode and source and drain electrodes. Thus, due to the silica aerogel layer having a very low dielectric constant, parasitic capacitance between the head portion of the gate electrode and the source electrode is remarkably reduced.

In the semiconductor device according to the present invention, a silica aerogel layer having a low dielectric constant is used as an insulating layer interposed between the gate electrode and the source and drain electrodes. In other words, in manufacturing an FET using a compound semiconductor, such as a MESFET or a HEMT, an insulating layer forming a stable passivation layer on the surface of the semiconductor substrate, for example, a silicon nitride layer is deposited to a small thickness, and then, the silica aerogel layer having a low dielectric constant is deposited on the semiconductor substrate, thereby forming a passivation layer having a two-layer structure. In this structure, a material having a low dielectric constant is interposed between the head portion of the gate electrode and the source electrode such that parasitic capacitance between the head portion of the gate electrode and the source electrode is remarkably reduced.

Thus, according to the present invention, in the field effect transistor having a T-shaped gate electrode, parasitic capacitance between the gate electrode and the source electrode is reduced, such that deterioration of the characteristic of a device is prevented, signal transmission is more quickly performed, and a device having an increased number of cut-off frequency in an RF characteristic is manufactured.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device comprising:
   a semiconductor substrate;
   source and drain electrodes, which are formed on the semiconductor substrate to make ohmic contact with the semiconductor substrate;
   a T-shaped gate electrode, which is formed between the source and drain electrodes on the semiconductor substrate;
   a first insulating layer formed on the semiconductor substrate and is in direct contact with the source electrode, the drain electrode and the T-shaped gate electrode;
   a silica aerogel layer formed on the first insulating layer; and
   a second insulating layer formed on the silica aerogel layer, the source electrode and the drain electrode, the second insulating layer including silica aerogel, the second insulating layer is directly in contact with the T-shaped gate electrode.

2. The semiconductor device of claim 1, wherein the first insulating layer is formed of silicon nitride and the second insulating layer formed of silica aerogel.

3. The semiconductor device of claim 2, wherein the silica aerogel layer has a thickness greater than the thickness of the first insulating layer.

4. The semiconductor device of claim 2, wherein the first insulating layer has a thickness of 100–1000 Å.

5. The semiconductor device of claim 1, wherein the silica aerogel layer has a thickness of 1000–3000 Å.

* * * * *